United States Patent
Song et al.

(10) Patent No.: US 9,647,141 B2
(45) Date of Patent: May 9, 2017

(54) THIN FILM TRANSISTOR AND METHOD OF MANUFACTURING THE SAME

(71) Applicants: BOE Technology Group Co., Ltd., Beijing (CN); Hefei Xinsheng Optolectronics Technology Co., Ltd., Anhui (CN)

(72) Inventors: Botao Song, Beijing (CN); Tao Jiang, Beijing (CN); Junhao Han, Beijing (CN); Ling Han, Beijing (CN); Binbin Cao, Beijing (CN); Chengshao Yang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/098,385

(22) Filed: Apr. 14, 2016

(65) Prior Publication Data

US 2016/0351725 A1  Dec. 1, 2016

(30) Foreign Application Priority Data

May 26, 2015 (CN) .......................... 2015 1 0273988

(51) Int. Cl.
*H01L 29/10* (2006.01)
*H01L 29/786* (2006.01)
*H01L 27/12* (2006.01)

(52) U.S. Cl.
CPC ...... *H01L 29/78696* (2013.01); *H01L 27/127* (2013.01); *H01L 27/1225* (2013.01); *H01L 27/1288* (2013.01); *H01L 29/7869* (2013.01); *H01L 29/78606* (2013.01)

(58) Field of Classification Search
CPC ......... H01L 29/78696; H01L 29/78606; H01L 29/7869; H01L 27/1225; H01L 27/127; H01L 27/1288
USPC ......................................................... 257/43
See application file for complete search history.

(56) References Cited

U.S. PATENT DOCUMENTS

2002/0000557 A1* 1/2002 Kido ................... H01L 21/0274
257/66

* cited by examiner

*Primary Examiner* — Tu-Tu Ho
(74) *Attorney, Agent, or Firm* — Westman, Champlin & Koehler, P.A.

(57) ABSTRACT

Embodiments of the present disclosure provide a thin film transistor (TFT) and a method of manufacturing the same, which enables to decrease the vertical resistance from the source and the drain to the polarity inversion region, so that the current from the source and the drain to the polarity inversion region may be increased, thereby improving the performances of the TFT. An active layer of the TFT is provided with a first groove and a second groove which neither pass through the active layer. A source and a drain of the TFT are formed at least partially in the first groove and the second groove, respectively. The source and the drain contact the active layer through the first groove and the second groove, respectively.

13 Claims, 3 Drawing Sheets

THIN FILM TRANSISTOR AND METHOD OF MANUFACTURING THE SAME

CROSS-REFERENCE TO RELATED APPLICATION

This application claims the benefit of Chinese Patent Application No. 201510273988.3 filed on May 26, 2015 in the State Intellectual Property Office of China, the whole disclosure of which is incorporated herein by reference.

BACKGROUND OF THE INVENTION

Field of the Invention

Embodiments of the present disclosure relate to a field of display technology, in particular, to a thin film transistor and a manufacturing method thereof.

Description of the Related Art

A thin film transistor (TFT) is an insulated gate field effect transistor, which is generally manufactured by means of depositing a variety of thin films, such as a semiconductor active layer, a dielectric layer and a metallic electrode layer, on a substrate. The TFT has a significant effect on performance of a display device.

A schematic view showing resistances of a common TFT is illustrated in FIG. 1, which comprising a gate, a gate insulation layer, an etch stop layer (ESL), an active layer and a metal layer for forming a source and a drain. Specifically, the source and the drain may be formed by means of making holes in the ESL and then depositing the source and the drain in the holes. In FIG. 1, the reference numeral 101 represents the gate of the TFT, the reference numeral 102 represents the gate insulation layer of the TFT, the reference numeral 105 represents the ESL of the TFT, the reference numeral 103 represents the active layer of the TFT, the reference numeral 104 represents the metal layer of the TFT, the reference numerals R1, R5 represent contact resistances between the metal layer and the ESL and the reference numeral R3 represents a lateral resistance between the metal layer and the ESL. Moreover, as a polarity inversion region is located between the active layer and the gate insulation layer, there are vertical resistances R2, R4 from the source and the drain to between the active layer and the gate insulation layer. The vertical resistances will cause a current from the source and the drain to the polarity inversion region (which is between the active layer and the gate insulation layer) to be decreased, so that performance of the TFT may be degraded, for example, an on-state current of the TFT may be decreased, thereby degrading performance of charging a pixel capacitor.

SUMMARY OF THE INVENTION

Embodiments of the present disclosure provide a thin film transistor and a method of manufacturing the same, which enables to decrease the vertical resistance from the source and the drain to the polarity inversion region, thereby increasing the current from the source and the drain to the polarity inversion region and improving the performances of the TFT.

According to an aspect of the present disclosure, it is provided a thin film transistor, comprising: an active layer, a source and a drain, wherein the active layer of the thin film transistor is provided with a first groove and a second groove which neither pass through the active layer, the source and the drain of the thin film transistor are formed at least partially in the first groove and the second groove, respectively, and the source and the drain are in contact with the active layer through the first groove and the second groove, respectively.

In some implementations, the active layer is a metallic oxide semiconductor active layer, and the thin film transistor further comprises an etch stop layer formed on the metallic oxide semiconductor active layer, wherein holes which pass through the etch stop layer are formed in a region of the etch stop layer that is in contact with the first groove and the second groove, and the source and the drain of the thin film transistor are in contact with the active layer through the respective holes as well as the first groove and the second groove, respectively.

In some implementations, the grooves and the holes have circular cross sections, undo diameter of the groove is smaller than or equal to a diameter of the hole.

In some implementations, a part of the active layer without the grooves has a thickness in a range of from 400 Å to 1000 Å.

According to a second aspect of the present disclosure, it is provided a thin film transistor array substrate which comprises the thin film transistor according to any one of the above aspect or implementations.

According to a third aspect of the present disclosure, it is provided a method of manufacturing a thin film transistor, wherein the method comprising:

forming a first groove and a second groove in an active layer, wherein the first groove and the second groove neither pass through the active layer; and forming a source and a drain of the thin film transistor through a patterning process, wherein the source and the drain are formed at least partially in the first groove and the second groove, respectively, and are in contact with the active layer through the first groove and the second groove, respectively.

In some implementations, the method further comprises:

forming an etch stop layer by deposition on the active layer in a case that the active layer is a metallic oxide semiconductor active layer; and forming holes which pass through the etch stop layer in a region of the etch stop layer that is in contact with the first groove and the second groove, before forming the source and the drain of the thin film transistor through the patterning process;

wherein, the source and the drain are in contact with the active layer through the respective holes as well as the first groove and the second groove, respectively.

In some implementations, the step of forming the first groove and the second groove in the active layer comprises:

coating a photoresist on a substrate on which an active layer film has been formed;

exposing the active layer film by employing an inductively coupled plasma (ICP) equipment and using a half tone mask (HTM) method and developing the exposed active layer film to form a photoresist fully reserved region, a photoresist partially reserved region and a photoresist fully removed region, wherein the photoresist fully reserved region corresponds to a region of the active layer without the grooves, the photoresist partially reserved region corresponds to a region of the first and second grooves, the photoresist fully removed region corresponds to a region of the active layer film excluding the region of the active layer without the grooves and the region of the first and second grooves;

fully removing a part of the active layer film in the photoresist fully removed region by using an etching process;

removing the photoresist in the photoresist partially reserved region by using an ashing process; and peeling off the photoresist in the photoresist fully reserved region to expose the active layer.

In some implementations, the step of forming the holes comprises:

forming the holes which pass through the etch stop layer in the region of the etch stop layer that is in contact with the first groove and the second groove by using an enhanced capacitive coupled plasma (ECCP) equipment, wherein a diameter of the groove is smaller than or equal to a diameter of the hole.

In some implementations, a thickness of a part of the active layer without the grooves is in a range of from 400 Å to 1000 Å.

Embodiments of the present disclosure provide a thin film transistor (TFT) and a manufacturing method thereof. An active layer of the TFT is provided with a first groove and a second groove which neither pass through the active layer. A source and a drain of the TFT are formed at least partially in the first groove and the second groove, respectively. The source and the drain contact the active layer through the first groove and the second groove, respectively. In this way, the vertical resistance from the source and the drain to the polarity inversion region (which is between the active layer and the gate insulation layer) may be decreased by reducing the distance from the source and the drain to the polarity inversion region, so that the current from the source and the drain to the polarity inversion region may be increased, thereby improving the performances of the TFT.

BRIEF DESCRIPTION OF THE DRAWINGS

In order to explain the technical solutions in the embodiments of the present disclosure more clearly, the drawings needed for the description of the embodiments or the prior art will be briefly described in the following. It is obvious that the described drawings are only related to some embodiments of the invention. Based on these accompanying drawings, those skilled in the art can obtain other drawing(s), without any inventive work.

DETAILED DESCRIPTION OF PREFERRED EMBODIMENTS OF THE INVENTION

The technical solutions in the embodiments of the present disclosure will be described clearly and completely in combination with the accompanying drawings. It is apparent that the embodiments as described are merely a part of embodiments of the present disclosure and do not represent all embodiments. All other embodiments readily conceivable by the skilled in the art based on the described embodiments of the present disclosure without creative works fall into the protective scope of the present disclosure.

Embodiments of the present disclosure provide a thin film transistor (TFT) including an active layer and a source and a drain. The active layer of the TFT is provided with a first groove and a second groove which neither pass through the active layer. The source and the drain of the TFT are formed at least partially in the first groove and the second groove, respectively. The source and the drain are in contact with the active layer through the first groove and the second groove, respectively.

Figure 1:
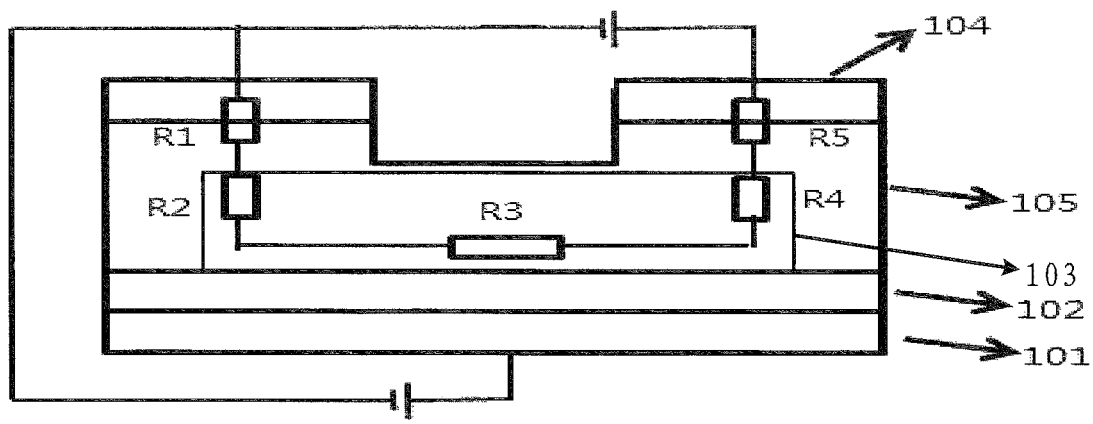
FIG. 1 is a schematic view showing resistances in a common TFT structure.

In case that the active layer of the TFT is a nonmetallic oxide semiconductor active layer, the TFT is not provided with an etch stop layer (ESL). In order to decrease the resistance from the source and the drain to the polarity inversion region (which is between the active layer and the gate insulation layer) in the active layer, a region of the active layer that is in contact with the source and the drain may be slotted to form a groove which does not pass through the active layer. In this way, a distance from the source and the drain to the polarity inversion region is decreased, so that the vertical resistance from the source and the drain to the polarity inversion region may be effectively decreased. Referring to the resistances schematic view shown in FIG. 1, the resistances R2, R4 may be decreased, and thus the current from the source and the drain to the polarity inversion region may be increased, thereby improving the performances of the TFT. For example, for a liquid crystal display, as the current from the source and the drain to the polarity inversion region is increased, a rate of charging the pixel capacitor of the TFT may be increased.

Figure 2:
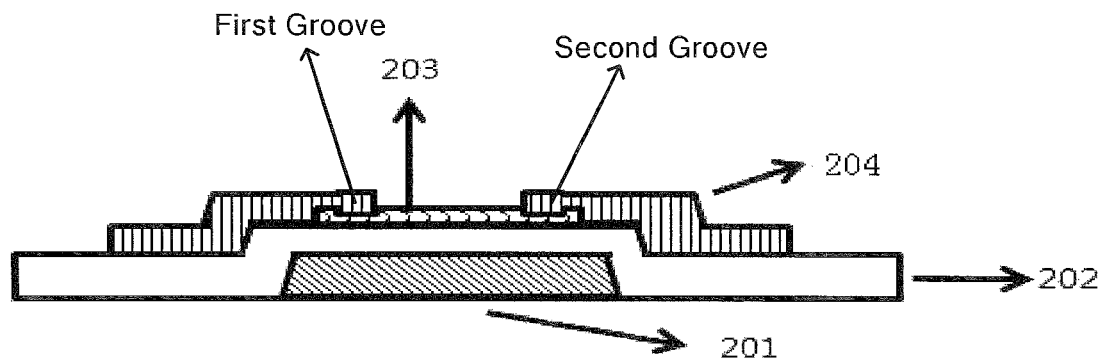
FIG. 2 is a structural schematic view of a bottom-gate TFT with grooves and a nonmetallic oxide semiconductor active layer according to an embodiment of the present disclosure.
Figure 3:
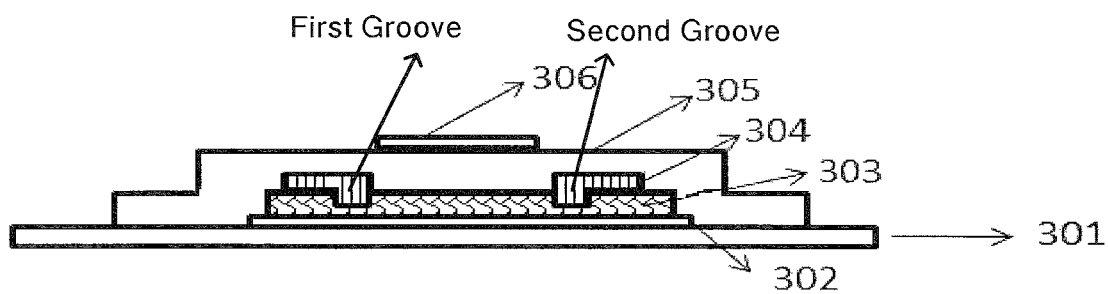
FIG. 3 is a structural schematic view of a top-gate TFT with grooves and a nonmetallic oxide semiconductor active layer according to an embodiment of the present disclosure.

In a case that the active layer of the TFT is a nonmetallic oxide semiconductor active layer, a TFT according to embodiments of the present disclosure may be a bottom-gate TFT with the first groove and the second groove, which has a structural schematic view as illustrated in FIG. 2. As shown in FIG. 2, the TFT includes a source and a drain, in which the source of the TFT is formed at least partially in the first groove while the drain is formed at least partially in the second groove. The TFT may further include a gate 201, a gate insulation layer 202, a nonmetallic oxide semiconductor active layer 203 and a metal layer 204. Alternatively, the source of the TFT may be formed at least partially in the second groove while the drain may be formed at least partially in the first groove. A structural schematic view of a top-gate TFT with the first groove and the second groove according to embodiments of the present disclosure is illustrated in FIG. 3. As shown in FIG. 3, the TFT includes a source and a drain, in which the source of the TFT is formed at least partially in the first groove while the drain is formed at least partially in the second groove. The TFT may further include a glass substrate 301, a black insulation film layer 302, a nonmetallic oxide semiconductor active layer 303, a metal layer 304, a gate insulation layer 305 and a gate 306. Alternatively, the source of the TFT may be formed at least partially in the second groove while the drain may be formed at least partially in the first groove.

In a case that the active layer of the TFT is a metallic oxide semiconductor active layer, an etch stop layer may be further provided on the metallic oxide semiconductor active layer. In a region, which is in contact with the first groove and the second groove, of the etch stop layer on the metallic oxide semiconductor active layer, holes which pass through the etch stop layer may be provided, and the source and the drain of the TFT may be in contact with the active layer via the respective holes as well as the first groove and the second groove, respectively.

In other words, In a case that the active layer of the TFT is a metallic oxide semiconductor active layer, after the metallic oxide semiconductor active layer is deposited and the grooves are formed by slotting in the metallic oxide semiconductor active layer, the etch stop layer is deposited on the metallic oxide semiconductor active layer with the grooves and the holes which pass through the etch stop layer are then formed by punching in a region of the etch stop layer which is in contact with the grooves. In this way, when the metal layer is deposited on the etch stop layer, it will be deposited into the grooves in the active layer through the holes, thereby similarly reducing the distance from the source and the drain to the polarity inversion region, so that the vertical resistance from the source and the drain to the polarity inversion region is decreased, and the current from the source and the drain to the polarity inversion region may thus be increased.

Figure 4:
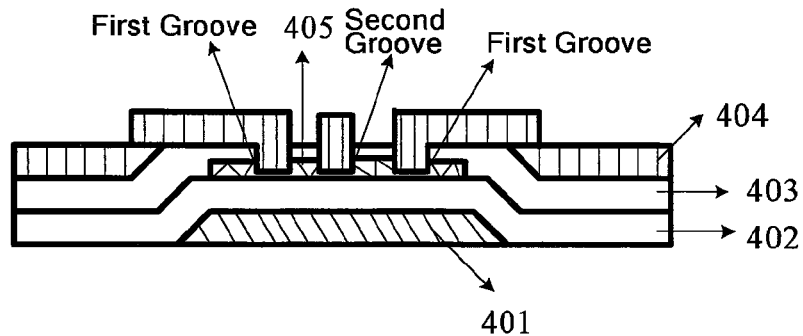
FIG. 4 is a structural schematic view of a bottom-gate TFT with grooves and a metallic oxide semiconductor active layer according to an embodiment of the present disclosure.
Figure 5:
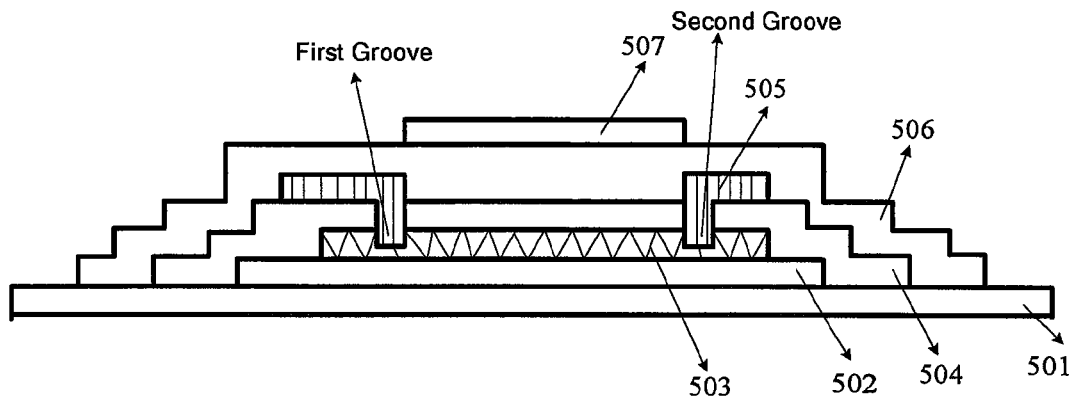
FIG. 5 is a structural schematic view of a top-gate TFT with grooves and a metallic oxide semiconductor active layer according to an embodiment of the present disclosure.

In a case that the active layer of the TFT is a metallic oxide semiconductor active layer, a structural schematic view of a bottom-gate TFT with the grooves is illustrated in FIG. 4. The TFT includes a source, a drain, a gate 401, a gate insulation layer 402, an etch stop layer 403, a metal layer 404 and a metallic oxide semiconductor active layer 405. As shown in FIG. 4, the source of the TFT is formed at least partially in the first groove while the drain is formed at least partially in the second groove. Alternatively, the source of the TFT is formed at least partially in the second groove while the drain is formed at least partially in the first groove. As shown in FIG. 5, FIG. 5 illustrates a structural schematic view of a top-gate TFT with grooves. The TFT includes a source, a drain, a glass substrate 501, a black insulation film layer 502, a metallic oxide semiconductor active layer 503, an etch stop layer 504, a metal layer 505, a gate insulation layer 506 and a gate 507. As shown in FIG. 5, the source of the TFT is formed at least partially in the first groove while the drain is formed at least partially in the second groove. Alternatively, the source of the TFT is formed at least partially in the second groove while the drain is formed at least partially in the first groove.

Figure 6:
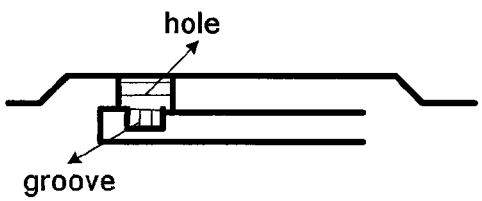
FIG. 6 is schematic view showing a groove in the active layer and a hole in an etch stop layer according to an embodiment of the present disclosure.

It should be noted that the grooves and the holes may have a circular cross section, a square cross section or a cross section of other shapes in the structures of the metallic oxide TFT, and it is not limited to the present disclosure. Referring to FIG. 4, in a case that the grooves and the holes have a circular cross section, the diameter of the groove may be less than or equal to the diameter of the hole for the following reasons. As shown in FIG. 6, the metal deposited into the hole and the groove have a larger contact area with the etch stop layer for a TFT in which the diameter of the groove is less than or equal to the diameter of the hole compared to a TFT in which the diameter of the groove is bigger than the diameter of the hole. In this way, when the diameter of the groove is configured to be less than the diameter of the hole, it may not only reduce the distance from the source and drain to the polarity inversion region but also increase the contact area of the source and the drain with the etch stop layer, the increased contact area will further decrease the resistance from the source and drain to the polarity inversion region, so that the current will be further increased. If the diameter of the groove is bigger than the diameter of the hole, the contact area of the source and the drain with the etch stop layer will be decreased, which may cause an effect of decreasing the resistance by reducing the distance from the source and drain to the polarity inversion region to be insignificant or even increase the resistance.

Further, a thickness of a part of the active layer without the groove may be in a range of from 400 Å to 1000 Å, or other values, and the present disclosure is not limited thereto.

Embodiments of the present disclosure provide a thin film transistor (TFT) including an active layer and a source and a drain. The active layer of the TFT is provided with a first groove and a second groove which neither pass through the active layer. The source and the drain of the TFT are formed at least partially in the first groove and the second groove, respectively. The source and the drain are in contact with the active layer through the first groove and the second groove, respectively. In this way, the vertical resistance from the source and the drain to the polarity inversion region (which is between the active layer and the gate insulation layer) may be decreased by reducing the distance from the source and the drain to the polarity inversion region, and thus the current from the source and the drain to the polarity inversion region may be increased, thereby improving the performances of the TFT.

Figure 7:
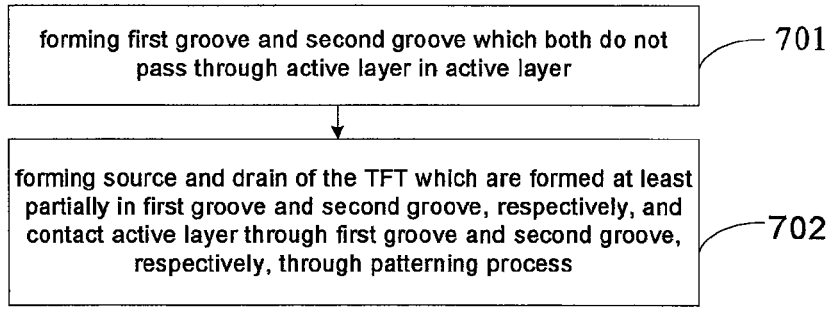
FIG. 7 is a flow chart of a manufacturing method of a thin film transistor according to an embodiment of the present disclosure.

As shown in FIG. 7, embodiments of the present disclosure provide a method of manufacturing a thin film transistor (TFT). The method comprises:

step 701: forming a first groove and a second groove which neither pass through the active layer in the active layer;

step 702: forming a source and a drain of the TFT through a patterning process, in which the source and the drain are formed at least partially in the first groove and the second groove, respectively, and are in contact with the active layer through the first groove and the second groove, respectively.

During the above process, formation, such as deposition, of each layer may include exposure, development, etching and peeling processes.

It will be described next by taking the TFT having a bottom-gate structure and a metallic oxide semiconductor active layer as shown in FIG. 4 as an example.

Figure 8:
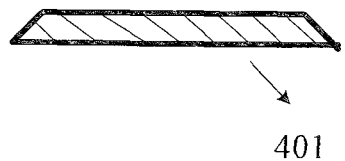
FIG. 8 is a structural schematic view of a gate in the thin film transistor according to an embodiment of the present disclosure.
Figure 9:
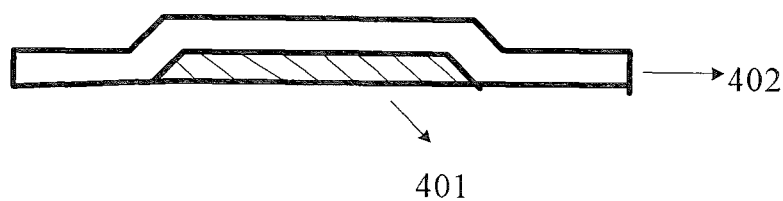
FIG. 9 is a structural schematic view of a gate and a gate insulation layer in the thin film transistor according to an embodiment of the present disclosure.
Figure 10:
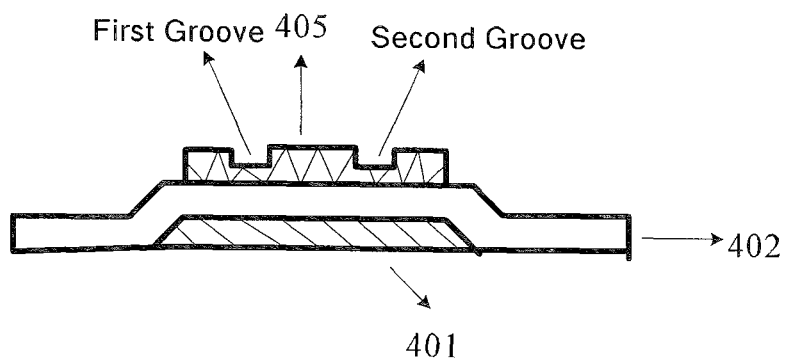
FIG. 10 is a structural schematic view of a gate, a gate insulation layer and an active layer with grooves in the thin film transistor according to an embodiment of the present disclosure.
Figure 11:
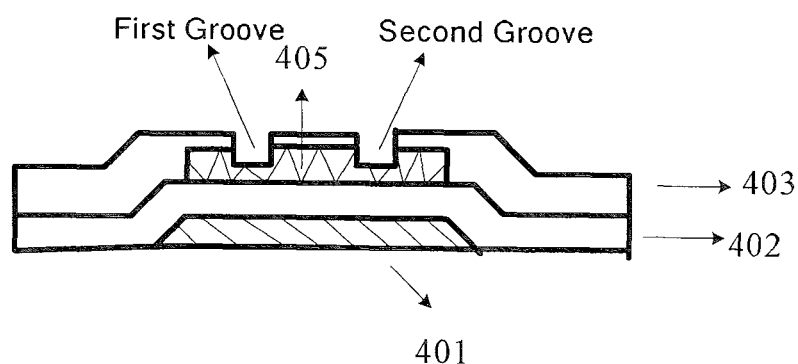
FIG. 11 is a structural schematic view of a gate, a gate insulation layer, an active layer with grooves and an etch stop layer with holes in the thin film transistor according to an embodiment of the present disclosure.

Specifically, before the step 701, a gate (as shown in FIG. 8) is formed through a deposition process, and a gate insulation layer (as shown in FIG. 9) is formed by deposition on the gate, then the metallic oxide semiconductor active layer is formed by deposition on the gate insulation layer. Thereafter, the step 701 is performed. More particularly, the grooves which do not pass through the active layer are formed in the active layer, that is, there are still a part of metallic oxide semiconductor remaining in the active layer when the grooves have been formed in the active layer, as shown in FIG. 10; then an etch stop layer is formed by deposition on the active layer, and holes (as shown in FIG. 11) which pass through the etch stop layer are formed in a region of the etch stop layer that is in contact with the first groove and the second groove. In general, the TFT may include two sources and one drain, or include one source and two drains. Thus, three grooves are formed in the active layer of the TFT, including two first grooves and one second groove, or alternatively, one first groove and two second grooves.

Specifically, during forming the groove, a half tone mask (HTM) method may be used to slot in the active layer so as to form the groove which does not pass through the active layer. The half tone mask (HTM) technology may be interpreted as an opening technique and may enable the active layer not to be penetrated through.

As an example, a photoresist may be firstly coated over the substrate on which the active layer film has been formed; the active layer film is exposed through the HTM method and then developed to form a photoresist fully reserved region, a photoresist partially reserved region and a photoresist fully removed region. Specifically, the photoresist fully reserved region corresponds to a region of the active layer without the grooves, the photoresist partially-reserved region corresponds to a region of the first and second grooves, the photoresist fully-removed region correspond to a region of the active layer film excluding the regions of the active layer without the grooves and the region of the first and second grooves. The part of the active layer film corresponding to the photoresist fully removed region is removed by using an etching process, the photoresist in the photoresist partially reserved region is removed by using an ashing process and the photoresist in the photoresist fully reserved region is peeled off to expose the active layer.

In a case that the active layer is a nonmetallic oxide semiconductor active layer, a metal layer for forming the source and the drain may be formed on the active layer by deposition after the active layer has been formed through a deposition process, that is, the step 702 is performed. At this moment, the metal layer covering the active layer may be deposited into the first groove and the second groove of the active layer, that is, the source and the drain contact the active layer through the first groove and the second groove, respectively, thereby reducing the distance from the source and the drain to the polarity inversion region between the active layer and the gate insulation layer, so that the resistance from the source and the drain to the polarity inversion region may decreased and the current may be increased.

In a case that the active layer is a metallic oxide semiconductor active layer, the method further comprises: before step 702, forming an etch stop layer firstly on the active layer by deposition, and forming holes (as shown in FIG. 11) which pass through the etch stop layer in a region of the etch stop layer that is in contact with the first groove and the second groove before forming the source and the drain of the TFT through a patterning process. The process for forming the holes is similar to that in the prior art and will be omitted here.

Specifically, the groove and the hole may have a circular cross section, a square cross section or a cross section of other shapes, it is not limited to the present disclosure. In a case that the groove and the hole have a circular cross section, the diameter of the groove may be less than or equal to the diameter of the hole for the following reasons. As shown in FIG. 6, the metal deposited into the hole and the groove has a larger contact area with the etch stop layer for a TFT in which the diameter of the groove is less than or equal to the diameter of the hole compared to a TFT in which the diameter of the groove is bigger than the diameter of the hole. In this way, when the diameter of the groove is configured to be less than the diameter of the hole, it may not only reduce the distance from the source and drain to the polarity inversion region, but also increase the contact area of the source and the drain in contact with the etch stop layer, the increased contact area will further decrease the resistance from the source and drain to the polarity inversion region, so that the current will be further increased. If the diameter of the groove is bigger than the diameter of the hole, the contact area of the source and the drain in contact with the etch stop layer will be decreased, which may cause an effect of decreasing the resistance by reducing the distance from the source and drain to the polarity inversion region to be insignificant or even increase the resistance.

With regard to the formation processes of the grooves and the holes, the grooves and the holes may be formed respectively by implementing different bias powers of inductively coupled plasma (ICP) equipment or an enhanced capacitive coupled plasma (ECCP) equipment. Specifically, the ECCP equipment may involve physical etching and chemical etching processes, and its lower electrode is connected to two power sources, wherein a source power is mainly used to dissociate gas and a plasma bias power is mainly used to adjust a state of a plasma, so as to enable the plasma to act with the substrate, removing part of the nonmetallic film which is not covered by the photoresist. The ICP equipment also involves physical etching and chemical etching processes, and includes a coil induced electrode at its upper portion and a bias power at its lower portion. As electrons and ions in the plasma will make a helical motion in the horizontal direction under a magnetic field of the coil electrode, the ICP equipment has a higher bias power than other types of equipment, so that a high density plasma and a high etching rate may be achieved. Therefore, the ICP equipment may be used to apply an etching process for forming the groove which does not pass through the active layer in the active layer. The ECCP equipment may be used to apply an etching process for forming the hole in the etch stop layer. Obviously, other types of equipment may also be used, and the present disclosure is not limited thereto.

In this way, after formation of the holes in the etch stop layer, the metal layer is deposited on the etch, stop layer to form the source and the drain. The source and the drain are formed at least partially in the first groove and the second groove and are in contact with the active layer through the first groove and the second groove, respectively. Specifically, the source and the drain contact the active layer through the respective holes and the first and second grooves, respectively, that is, the metal contacting the grooves will be deposited into the grooves through the holes to contact the active layer. Finally, the TFT structure as shown in FIG. 4 may be obtained.

Embodiments of the present disclosure provide a method of manufacturing a thin film transistor (TFT). According to the method, after depositing the active layer, the first groove and the second groove which do not pass through the active layer are formed in the active layer, and the source and the drain of the TFT, which are formed at least partially in the first groove and the second groove and in contact with the active layer through the first groove and the second groove, respectively are formed through a patterning process. In this way, the vertical resistance from the source and the drain to the polarity inversion region (which is between the active layer and the gate insulation layer) may be decreased by reducing the distance from the source and the drain to the polarity inversion region, so that the current from the source and the drain to the polarity inversion region may be increased, thereby improving the performances of the TFT.

It should be appreciated that the devices and methods disclosed according to the embodiments of the present disclosure may be implemented in other ways.

The units described as separate components may be or may not be separated physically from on another. In addition, various functional units in various embodiments of the present disclosure may be integrated into one processing unit, or may be separated physically from one another, or two or more of the various functional units may be integrated into one unit. The integrated unit may be implemented in a hardware form or in a hardware plus software functional unit form.

Finally, it should be appreciated that the embodiments described above are merely intended to illustrate the present invention, instead of limit the present invention. Although the present invention has been described in detail herein with reference to the above embodiments, it should be understood by those skilled in the art that the present invention can be modified and some of the technical features can be equivalently substituted without departing from the spirit and scope of the present invention.

What is claimed is:

1. A thin film transistor, comprising:
a gate insulation layer, an active layer, a source and a drain, wherein
the active layer of the thin film transistor is provided with a first groove and a second groove which neither pass through the active layer, so that a vertical distance between a top surface of the gate insulation layer and a portion of a top surface of the active layer where the first groove and the second grove are formed, is less than a vertical distance between the top surface of the gate insulation layer and the other portion of the top surface of the active layer, the source and the drain of the thin film transistor are formed at least partially in the first groove and the second groove, respectively, and the source and the drain are in contact with the active layer through the first groove and the second groove, respectively.

2. The thin film transistor of claim 1, wherein, the active layer is a metallic oxide semiconductor active layer, and
the thin film transistor further comprises an etch stop layer formed on the metallic oxide semiconductor active layer, wherein holes which pass through the etch stop layer are formed in a region of the etch stop layer that is in contact with the first groove and the second groove, and the source and the drain of the thin film transistor are in contact with the active layer through the respective holes as well as the first groove and the second groove, respectively.

3. The thin film transistor of claim 2, wherein the grooves and the holes have circular cross sections, and a diameter of the groove is smaller than or equal to a diameter of the hole.

4. The thin film transistor of claim 1, wherein a part of the active layer without the grooves has a thickness in a range of from 400 Å to 1000 Å.

5. The thin film transistor of claim 2, wherein a part of the active layer without the grooves has a thickness in a range of from 400 Å to 1000 Å.

6. A thin film transistor array substrate comprising the thin film transistor of claim 1.

7. A method of manufacturing a thin film transistor, wherein the method comprising:
forming a gate insulation layer and an active layer;
forming a first groove and a second groove in the active layer, wherein the first groove and the second groove neither pass through the active layer, so that a vertical distance between a top surface of the gate insulation layer and a portion of a top surface of the active layer where the first groove and the second grove are formed, is less than a vertical distance between the top surface of the gate insulation layer and the other portion of the top surface of the active layer; and
forming a source and a drain of the thin film transistor through a patterning process, wherein the source and the drain are formed at least partially in the first groove and the second groove, respectively, and are in contact with the active layer through the first groove and the second groove, respectively.

8. The method of claim 7, further comprising:
forming an etch stop layer by deposition on the active layer in a case that the active layer is a metallic oxide semiconductor active layer; and
forming holes which pass through the etch stop layer in a region of the etch stop layer that is in contact with the first groove and the second groove, before forming the source and the drain of the thin film transistor through the patterning process;
wherein, the source and the drain are in contact with the active layer through the respective holes as well as the first groove and the second groove, respectively.

9. The method of claim 7, wherein, the step of forming the first groove and the second groove in the active layer comprises:
coating a photoresist on a substrate on which an active layer film has been formed;
exposing the active layer film by employing an inductively coupled plasma (ICP) equipment and using a half tone mask (HTM) method and developing the exposed active layer film to form a photoresist fully reserved region, a photoresist partially reserved region and a photoresist fully removed region, wherein the photoresist fully reserved region corresponds to a region of the active layer without the grooves, the photoresist partially reserved region corresponds to a region of the first and second grooves, the photoresist fully removed region corresponds to a region of the active layer film excluding the region of the active layer without the grooves and the region of the first and second grooves;
fully removing a part of the active layer film in the photoresist fully removed region by using an etching process;
removing the photoresist in the photoresist partially reserved region by using an ashing process; and
peeling off the photoresist in the photoresist fully reserved region to expose the active layer.

10. The method of claim 8, wherein, the step of forming the first groove and the second groove in the active layer, comprises:
coating a photoresist on a substrate on which an active layer film has been formed;
exposing the active layer film by employing an inductively coupled plasma (ICP) equipment and using a half tone mask (HTM) method and developing the exposed active layer film to form a photoresist fully reserved region, a photoresist partially reserved region and a photoresist fully removed region, wherein the photoresist fully reserved region corresponds to a region of the active layer without the grooves, the photoresist partially reserved region corresponds to a region of the first and second grooves, the photoresist fully removed region corresponds to a region of the active layer film excluding the region of the active layer without the grooves and the region of the first and second grooves;

fully removing a part of the active layer film in the photoresist fully removed region by using an etching process;

removing the photoresist in the photoresist partially reserved region by using an ashing process; and peeling off the photoresist in the photoresist fully reserved region to expose the active layer.

11. The method of claim 8, wherein, the step of forming the holes comprises:

forming the holes which pass through the etch stop layer in the region of the etch stop layer that is in contact with the first groove and the second groove by using an enhanced capacitive coupled plasma (ECCP) equipment, wherein a diameter of the groove is smaller than or equal to a diameter of the hole.

12. The method of claim 7, wherein a thickness of a part of the active layer without the grooves is in a range of from 400 Å to 1000 Å.

13. The method of claim 8, wherein a thickness of a part of the active layer without the grooves is in a range of from 400 Å to 1000 Å.

* * * * *